(12) United States Patent
Fallahi (10) Patent No.: US 6,608,536 B2
(45) Date of Patent: Aug. 19, 2003

(54) CONSTANT IMPEDANCE FILTER

(75) Inventor: Siavash Fallahi, Newport Coast, CA (US)

(73) Assignee: Broadcom Corporation, Irvine, CA (US)

(*) Notice: Subject to any disclaimer, the term of this patent is extended or adjusted under 35 U.S.C. 154(b) by 0 days.

(21) Appl. No.: 09/986,752

(22) Filed: Nov. 9, 2001

(65) Prior Publication Data

US 2002/0084871 A1 Jul. 4, 2002

Related U.S. Application Data (60) Provisional application No. 60/246,991, filed on Nov. 9, 2000.

(51) Int. Cl.[7] ............................................. H03H 7/06
(52) U.S. Cl. ..................... 333/168; 333/133; 333/172
(58) Field of Search ............................... 333/168, 172, 333/167, 175, 133

(56) References Cited

U.S. PATENT DOCUMENTS

| | | | | | |
|---|---|---|---|---|---|
| 1,615,252 A | * | 1/1927 | Zobel | .......................... | 333/168 |
| 2,041,098 A | * | 5/1936 | Whittle | ........................ | 333/168 |
| 2,076,248 A | * | 4/1937 | Norton | ........................ | 333/168 |
| 2,081,350 A | * | 5/1937 | Blau | ............................ | 333/172 |
| 2,594,019 A | * | 4/1952 | Holman | ....................... | 333/168 |
| 4,003,005 A | * | 1/1977 | Mukherjee et al. | .......... | 333/168 |
| 4,612,571 A | * | 9/1986 | Moon | ........................... | 333/174 |
| 4,794,353 A | * | 12/1988 | Broyde | ........................ | 333/168 |
| 5,491,367 A | * | 2/1996 | Schinzel | ...................... | 333/172 |

FOREIGN PATENT DOCUMENTS

| | | |
|---|---|---|
| EP | 0 977 408 A2 | 2/2000 |
| JP | 04186910 A * | 7/1992 |
| JP | 09008583 | 1/1997 |

OTHER PUBLICATIONS

International Search Report issued in PCT/US01/43037, dated Jul. 25, 2002.

* cited by examiner

*Primary Examiner*—Seungsook Ham
(74) *Attorney, Agent, or Firm*—Sterne, Kessler, Goldstein & Fox P.L.L.C.

(57) ABSTRACT

A constant impedance filter maintains a constant input impedance for frequencies that are both inside the filter passband and outside the filter passband. The constant input impedance appears as a pure resistance. The constant impedance filter includes a plurality of filter poles that are connected in series. Each of the filter poles include an inductor, a capacitor, and a resistor. The value of the inductor, the capacitor, and the resistor are selected to provide a constant input impedance over frequency for each pole of the filter, which produces a constant input impedance for the entire filter over frequency. The constant impedance filter can be implemented as a low pass filter, a high pass filter, or a bandpass filter. Furthermore, the constant impedance filter can be implemented in a single-ended configuration or a differential configuration.

21 Claims, 8 Drawing Sheets

CONSTANT IMPEDANCE FILTER

CROSS-REFERENCE TO RELATED APPLICATIONS

This application claims benefit of U.S. Provisional Application No. 60/246,991, filed on Nov. 9, 2000, which is incorporated by reference herein in its entirety.

BACKGROUND OF THE INVENTION

1. Field of the Invention

The present invention is related to a filter having a constant input impedance over frequency.

2. Background Art

In addition to data communications, the Internet can also be used to carry voice telephony. One conventional system that carries voice communications over the Internet utilizes an Internet Protocol (IP), and such telephones are referred to as IP telephones.

The data terminal equipment (DTE) of an IP telephone includes a telephone line that is connected to a computer device through a series-connected relay (i.e. switch). The relay switches an incoming telephone signal to either the computer or to a filter that is connected in parallel with the computer. The filter is connected/disconnected across the computer depending on the state of the IP phone system by closing/opening the associated relay. In a no power or "discovery" mode, the relay is switched so the filter is connected across a physical layer input of the computer. Therefore, the filter receives an incoming signal on the telephone line and passes low frequency signals back down the telephone line, without the incoming signal reaching the physical layer of the computer. The reflected low frequency signals indicate that a compatible IP phone is available for use. When power is applied to the relay in a "normal operation" mode, the relay is switched so the filter is disconnected from the input of the physical layer of the computer. Therefore, the filter does not effect the incoming signal, and the incoming signal is applied to the physical layer of the computer for further processing.

The continual opening and closing of the relay creates wear and tear on the relay components as the conventional IP phone switches between the discovery and normal modes, eventually causing component failure. It would be more cost-effective to keep the filter connected at all times, thereby eliminating relay replacement. Additionally, the conventional relay is not integrated with the computer or the filter, which increases the manufacturing part count and ultimately the manufacturing cost of an IP Phone.

The filter in the conventional IP telephone is a conventional lowpass filter. Conventional lowpass filters have an input impedance that is highly dependent on the frequency of the input signal that is delivered to the filter. In other words, the input impedance varies with the frequency of the input signal. Input frequencies that are inside the passband of the filter see a good impedance match and are substantially passed to the filter output. Input frequencies that are outside of the filter passband are substantially reflected, which causes an undesired high return loss that can reduce sensitivity in the IP phone system.

Additionally, conventional filters are highly sensitive to variations in the filter components and in the variation of components that are connected to the filter. This is undesirable as small changes in the filter components can cause large variations in the electrical characteristics of the filter. What is needed is a filter that has a constant impedance for all frequencies, even frequencies that are outside the passband of the filter. Furthermore, the filter should be relatively insensitive to component variation.

BRIEF SUMMARY OF THE INVENTION

The present invention is a constant impedance filter that maintains a constant input impedance through the filter for frequencies that are both inside the filter passband and outside the filter passband. The constant input impedance appears as a pure resistance to the incoming signals. In other words, frequencies both inside and outside the filter passband see a substantially matched impedance. Frequencies that are inside the passband are passed to the filter output. Frequencies that are outside the passband are terminated inside the filter, and are not reflected.

The constant impedance filter includes a plurality of filter poles that are connected in series. Each of the filter poles include an inductor, a capacitor, and a resistor. The value of the inductor, the capacitor, and the resistor are selected to provide a constant input impedance over frequency for each pole of the filter, which produces a constant input impedance for the entire filter over frequency. In embodiments of the invention, the filter components for each filter pole adhere to the equation, $C=L/R^2$, producing a constant input impedance of R for each filter pole. An entire filter will have a constant input impedance if the equation $C=L/R^2$ is maintained for each individual filter pole.

The constant impedance filter can have several embodiments depending on the type of frequency signals that are being processed. The filter embodiments include a lowpass filter, a highpass filter, and a bandpass filter, all having a constant input impedance over frequency. Furthermore, the lowpass, highpass, and bandpass filter embodiments can be constructed in both single-ended and differential circuit configurations.

BRIEF DESCRIPTION OF THE DRAWINGS/FIGURES

The present invention is described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Figure 1:
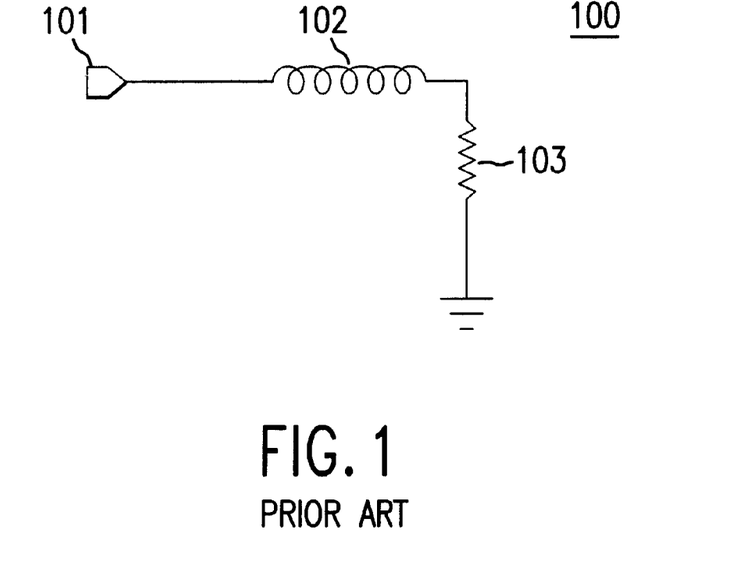
FIG. 1 illustrates a conventional low pass RL filter.

Filters are commonly used to prevent unwanted frequencies from passing to communication devices. For example, a conventionally known low pass filter consists of an inductor connected in series with a resistor. Referring to FIG. 1, a low pass filter 100 (an RL filter) is shown to have an inductor 102 connected to a resistor 103, which is grounded. One problem with the lowpass filter 100 is that the input impedance of the filter 100 is a function of frequency, as illustrated by the equations (1) and (2) below:

$$Z=R+sL \qquad (1)$$

$$|Z|=\sqrt{R^2+(\omega L)^2} \qquad (2)$$

wherein Z is the input impedance of the filter; R is resistance of the filter 102; ω is angular frequency; and ωL is inductive reactance of the inductor 102. As shown by equations (1) and (2), the input impedance of the lowpass filter 100 varies with frequency. The variable input impedance causes a variable return loss, which can decrease signal performance if there is a need for constant impedance circuitry.

Figure 2:
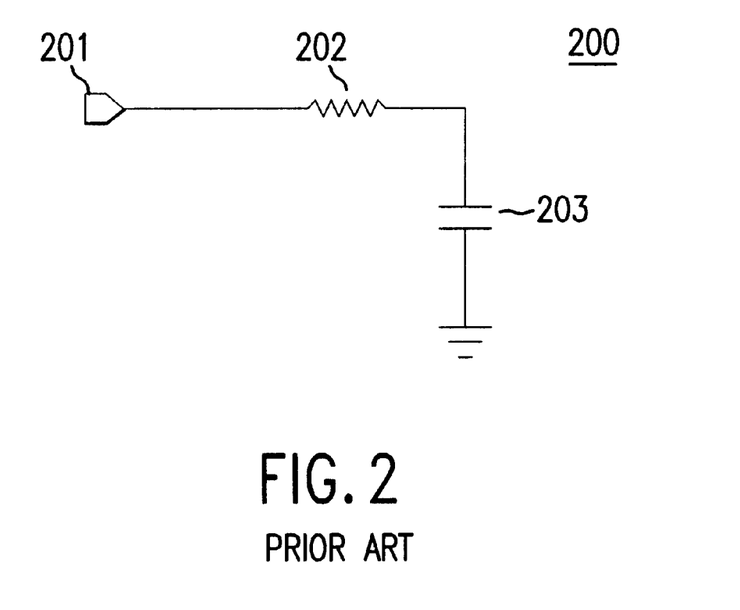
FIG. 2 illustrates a conventional low pass RC filter.

As illustrated in FIG. 2, another low pass filter 200 is shown to have a resistor 202 connected to a capacitor 203 (a single pole). Low pass filter 200 also has impedance that varies with frequency as presented by equations (3) and (4):

$$Z = R + \frac{1}{sC} \qquad (3)$$

$$|Z| = \sqrt{R^2 + \left(\frac{1}{\omega C}\right)^2} \qquad (4)$$

wherein C is the capacitance, R is resistance, ω is angular frequency, and $$\frac{1}{\omega C}$$

is capacitive reactance. As with the RL filter, the impedance of filter 200 varies with frequency, producing a variable return loss with frequency.

Figure 3:
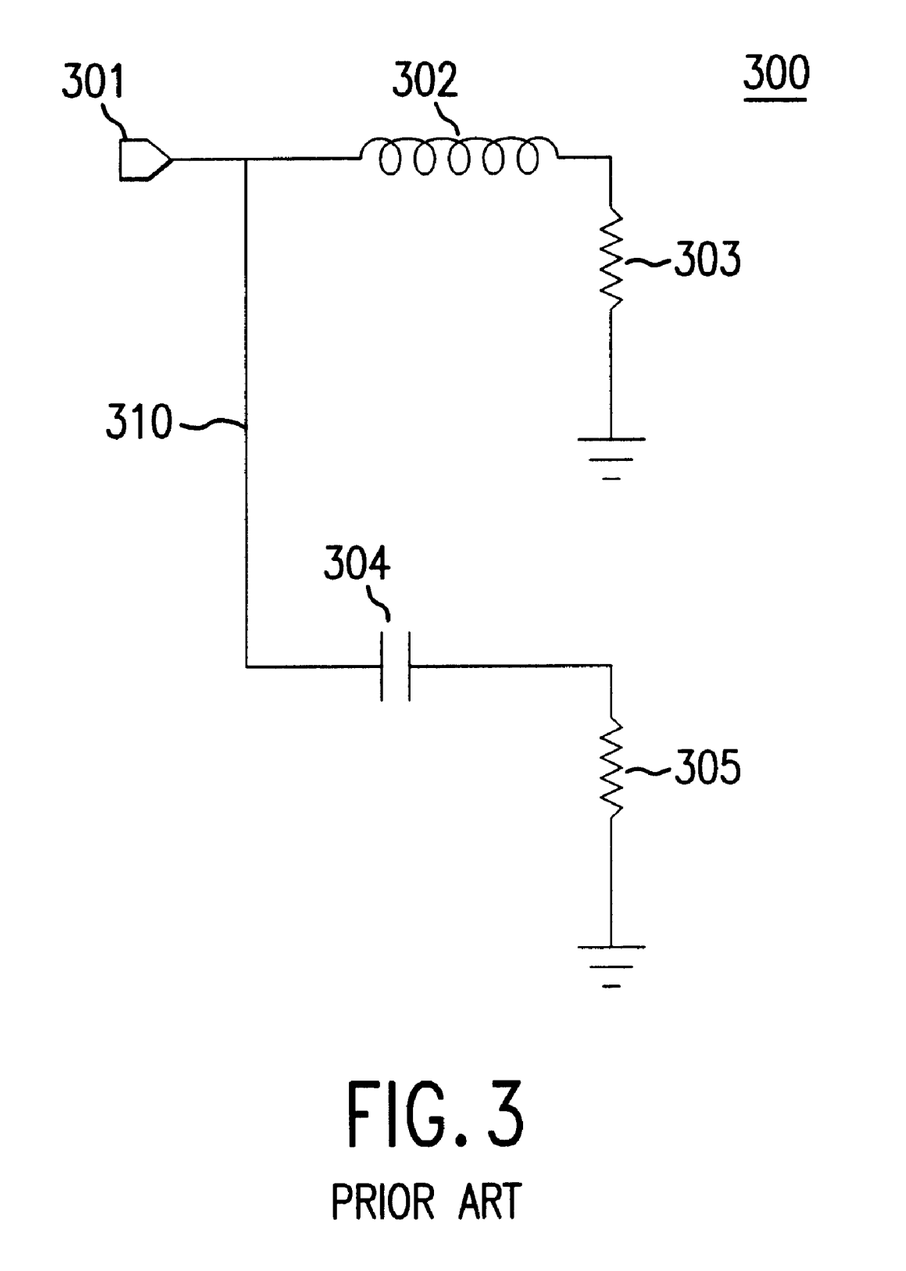
FIG. 3 illustrates a one pole bandpass filter.

FIG. 3 illustrates a low pass type filter 300 that has a constant impedance at all frequencies. Filter 300 includes an inductor 302 that series connected with a resistor 303. Inductor 302 and resistor 303 are further connected in parallel to a capacitor 304 that is series connected with resistor 305. This filter 300 is capable of maintaining the following relationship for substantially all frequencies:

$$Z=R \qquad (5)$$

wherein Z is the input impedance and is a pure resistance R. In embodiments, R is the resistance of the resistors 303 and 305, or a parallel combination thereof. The impedance in equation (5) is derived from equations (6) and (7) that are recited below:

$$Z = \left\{(R+sL)^{-1} + \left(R + \frac{1}{sC}\right)^{-1}\right\}^{-1} \qquad (6)$$

$$C = \frac{L}{R^2} \qquad (7)$$

The filter 300 is only a one pole solution. A single pole may not provide enough attenuation and therefore may allow some unwanted frequencies to pass through the filter.

Figure 4:
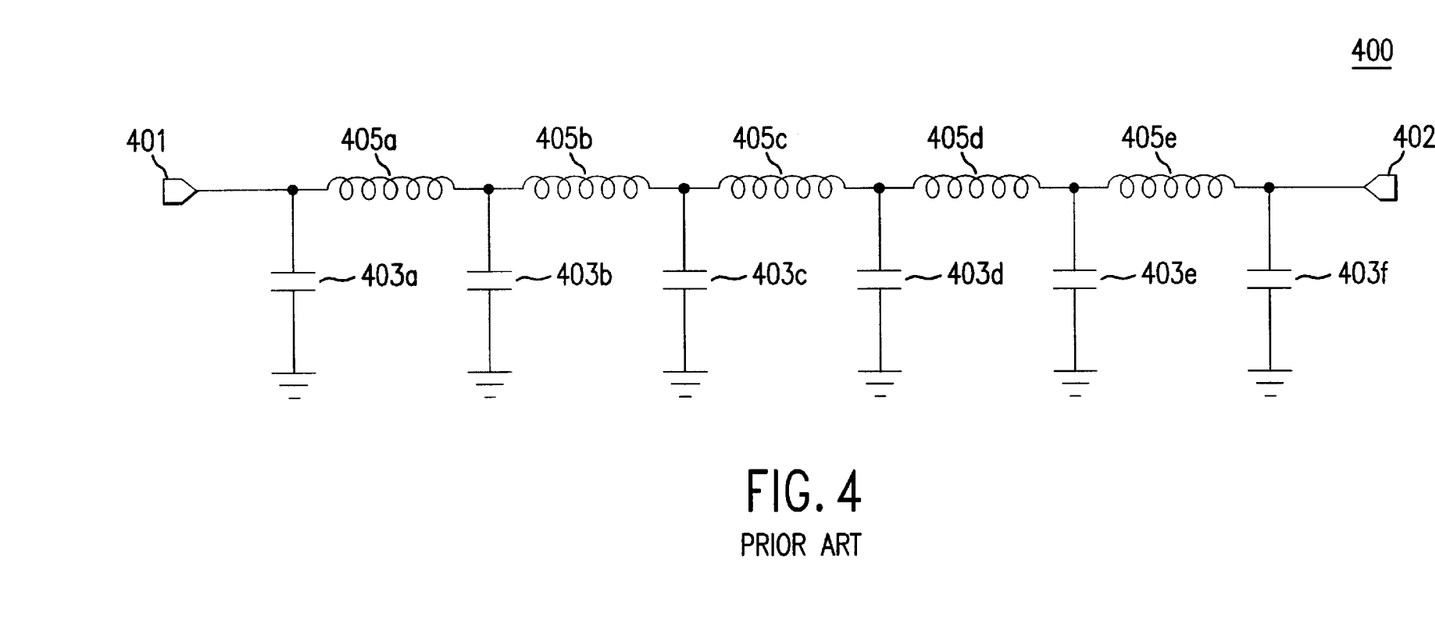
FIG. 4 illustrates a conventional Butterworth filter.

FIG. 4 illustrates a lowpass Butterworth filter 400. The filter 400 is a passive LC filter comprising of multiple poles (LC circuit groups). In one example, the Butterworth filter 400 is a 5-pole filter, wherein a pole includes an inductors 405 and a capacitor 403. The filter attenuation outside the passband of the filter 400 increases with the number of poles in the filter 400. However, as the number of poles in the Butterworth filter 400 increases, the filter response becomes more sensitive to component variations.

The impedance of the Butterworth filter 400 varies with frequency. Within the filter passband, the impedance of the filter is matched and the signals pass through. However, outside the passband, the impedance is high and the filter becomes totally reflective. A Butterworth filter can be configured in a low pass, high pass, and a band pass variety.

FIGS. 5–9 describe a constant impedance filter having multiple poles according to the present invention. A constant impedance filter maintains a constant input impedance through the filter for frequencies that are both inside and outside the filter passband. In other words, frequencies inside and outside the filter passband see a substantially matched impedance. Frequencies that are inside the filter passband are passed to the filter output. Frequencies that are outside the filter passband are terminated inside the filter, and are not reflected.

Figure 5:
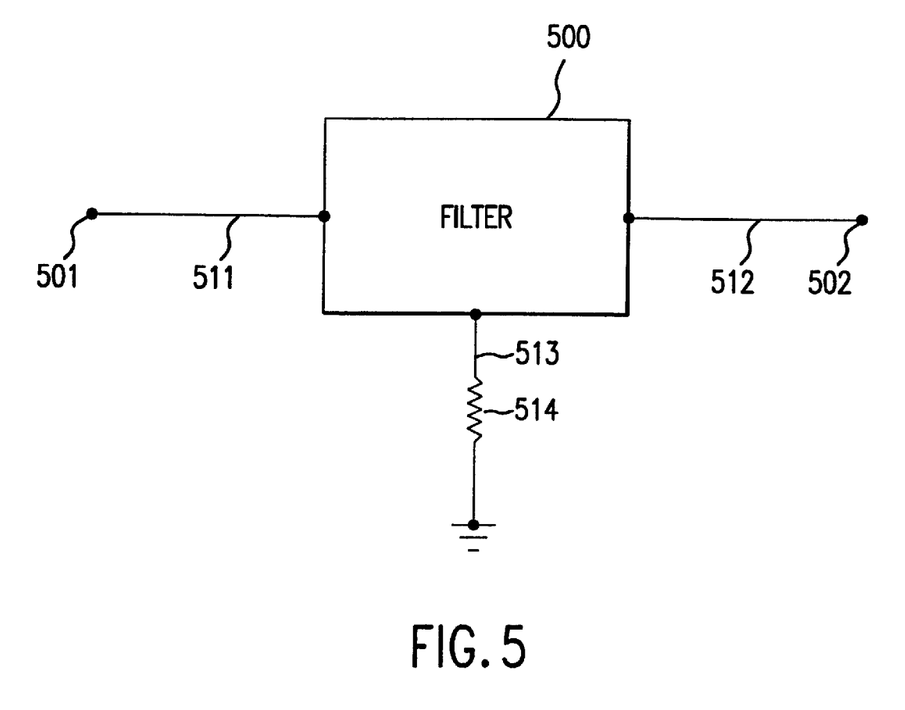
FIG. 5 illustrates a block diagram of the function of a constant impedance filter according to embodiments of the present invention.

FIG. 5 illustrates the function of a filter 500 according to the present. The filter 500 receives an input signal 511 having multiple frequency components. The filter 500 terminates unwanted frequencies 513 from the input signal 511 into a matched impedance 514, and passes the desired frequencies 512 to the filter output 502. The input impedance for the filter 500 is constant for substantially all frequencies, including those frequencies that are outside the filter passband. In other words, the input impedance of the filter 500 appears to be completely resistive.

Figure 6:
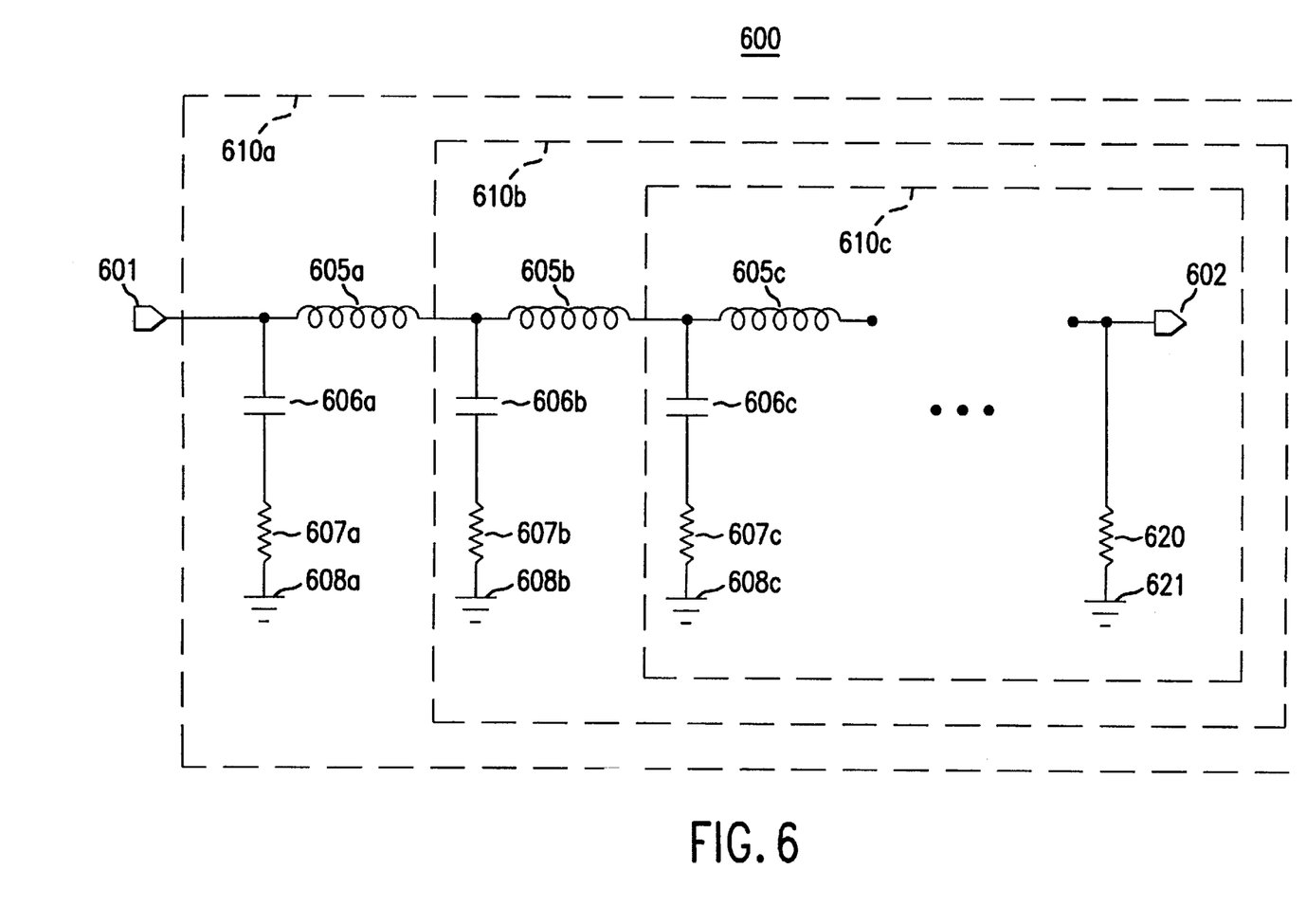
FIG. 6 illustrates a multi-pole constant impedance low pass filter, according to embodiments of the present invention.

FIG. 6 illustrates a constant impedance lowpass filter 600 according to embodiments the present invention. The filter 600 includes a plurality RLC circuit units or poles 610a, 610b, 610c, etc., that are connected in series with each other.

Each RLC circuit unit 610 includes an inductor 605, a capacitor 606, and a resistor 607 and a ground 608, along with a plurality of other poles 610 ending with a termination resistor 620. For instance, a pole 610a will include an inductor 605a, a capacitor 606a, a resistor 607a, a ground 608a, and the plurality of poles 610 (such as 610b, 610c, etc.) along with the termination resistor 620. The input signals come through the input terminals 601 and are filtered through the chain of the RLC circuits 610, to an output 602. The termination resistor 620 is connected between the output 602 to a ground 621.

The filter poles 610 in the filter 600 provide a constant input impedance regardless of frequency, if equations (5)–(7) is satisfied. More specifically, the input impedance of each pole 610 is equal to the resistance of the respective resistor 607, as long as the capacitance 606 and inductor 605 are chosen according to the relationship in Equation 7. As a result, the filter 600 appears as a pure resistor to the incoming signal. Frequencies that are outside the passband of the filter 600 are terminated in a matched impedance, and are not reflected. Frequencies that are inside the passband of the filter 600 are passed to the output 602.

The angular frequency cutoff of each pole may be determined by the following relationship:

$$\omega=R/L \qquad (8)$$

where, ω=2πf.

Each pole 610 can have the same frequency cutoff or each pole 610 can have a different cutoff frequency, depending on the specification of devices connected to the filter. If different cutoff frequencies are selected, then the effect of each pole 610 is cascaded over another pole 610. Nonetheless, the filter 600 would appear as a constant impedance filter across all frequencies as long the equations (5)–(7) are satisfied.

For a desired cutoff frequency and input impedance (which determines R), the values for L and C for each pole 610 can be calculated by solving equations 7 and 8. For example, if the desired input impedance is 100 ohm and the desired cutoff frequency is 2.274 MHz for a pole 610, then L is found using equation 8 and C is found using equation 7, where L is 7.0 uH and C is 700 pF.

As stated above, the cutoff frequencies of each pole 610 can be selected to be same, or the cutoff frequencies can be different in for each pole 610 in the filter 600. Additionally, the resistors 607 can be identical for each pole 610 in the filter 600, or the resistors 607 can vary from one pole 610 to another pole 610. If the resistors vary from pole to pole, then input impedance at 601 is the based combination of the resistors 607 in each pole 610 and the termination resistor 620, assuming that equations (5)–(7) are satisfied in each pole.

In one embodiment, the resistor 607 is the same for each pole 610 and is equal to the termination resistor 620. In this embodiment, the input impedance at the terminal 601 is the resistance of the resistor 607, assuming equations (5)–(7) are satisfied.

Figure 7:
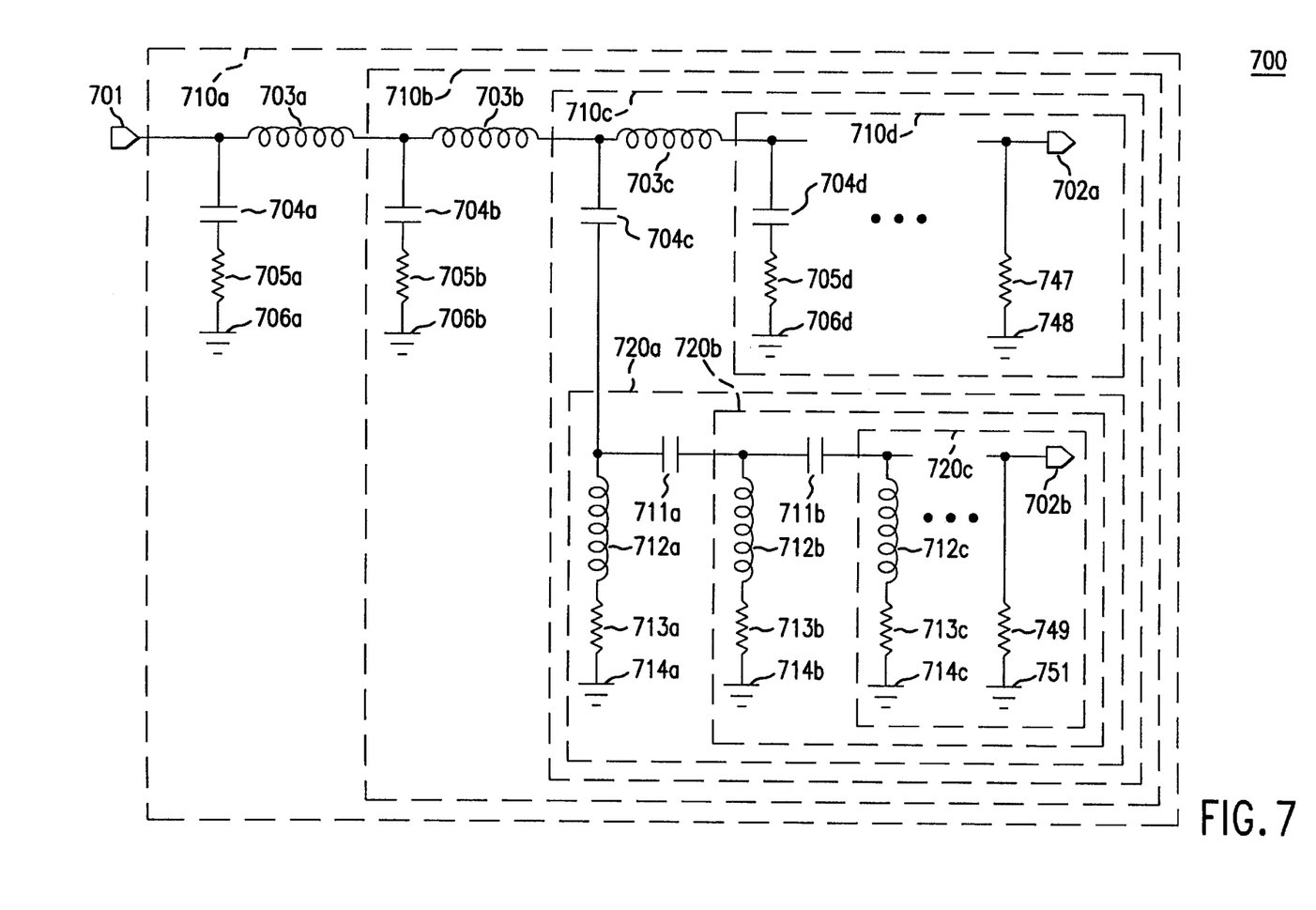
FIG. 7 illustrates a multi-pole constant impedance bandpass filter, according to embodiments of the present invention.

FIG. 7 illustrates a bandpass filter 700 that has a constant input impedance. Referring to FIG. 7, the input signals come in through an input terminal 701 encountering a series of RLC circuit units or poles 710 (a, b, c, etc.). Each pole 710 includes an inductor 703, a capacitor 704, and a resistor 705 and a ground 706, along with a plurality of other poles 710 ending with a termination resistor 747. For instance, a pole 710a will include an inductor 703a, a capacitor 704a, a resistor 705a, a ground 706a, along with a plurality of poles 710 (such as 710b, 710c, etc.) that end with the termination resistor 747. The chain of RLC poles 710 ends with the termination resistor 747 and a ground 748. In the pole 710c, the resistor (not shown) is removed leaving only the capacitor 704c (as shown). A chain of highpass circuits or poles 720 (a, b, c, etc.) are attached to one terminal of the capacitor 704c, so as to be in parallel with the lowpass poles 710. Therefore, the lowpass poles 710a, 710b, and 710c includes a plurality of lowpass poles 710 and the plurality of highpass poles 720 along with respective termination resistors 747 and 749. Subsequent lowpass poles 710 (i.e., 710d, 710e, etc.) include only the plurality of lowpass poles 710 and not the plurality of highpass poles 720. It is clear, that the plurality of highpass poles may be attached to the plurality of lowpass poles at any given lowpass pole 710. Each highpass pole 720 includes an inductor 712, a capacitor 711, and a resistor 713 and a ground 714 along with a plurality of other poles 720 ending with a termination resistor 749. For instance, a pole 720a will include an inductor 712a, a capacitor 711a, a resistor 713a, a ground 714a, and the plurality of poles 720 (such as 720b, 720c, etc.) along with the termination resistor 749. The filter 700 has a bandpass response determined by the lowpass cutoff frequency of the poles 710, and by the highpass cutoff frequency of the poles 720. The cutoff frequency of the lowpass poles 710 and the highpass poles 720 are determined by the equation 8. As in FIG. 6, the inductor and capacitors in the lowpass poles 710 and the highpass poles 720 can be selected to provide a constant input impedance for each pole 710, 720 by satisfying Equation (5)–(7). If the lowpass poles 710 and the highpass poles 720 are selected to have the same constant input impedance, then the input impedance of the at the terminal 701 will have the selected input impedance.

Figure 8:
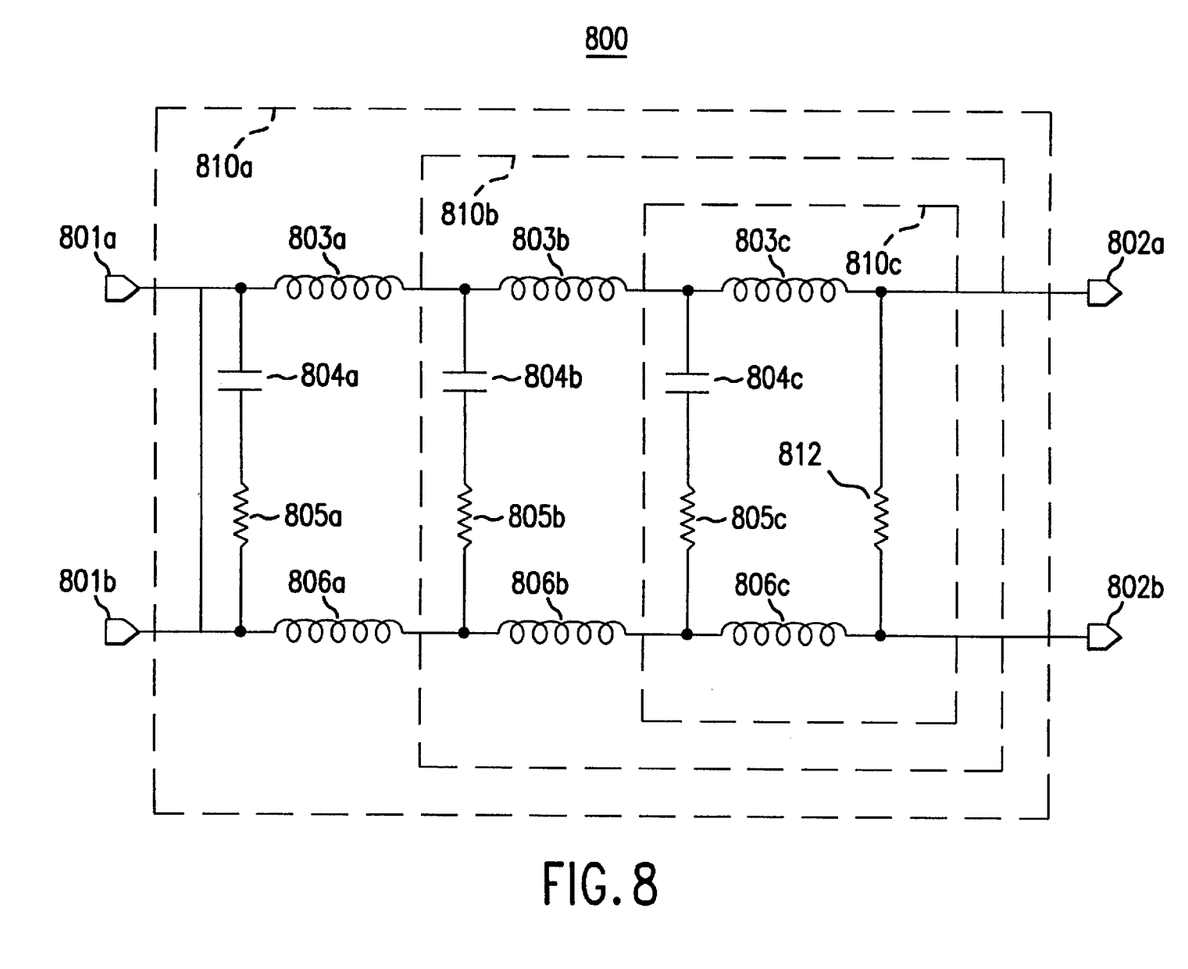
FIG. 8 illustrates a multi-pole constant impedance differential low pass filter, according to embodiments of the present invention.

FIG. 8 shows a differential lowpass filter 800 that has a constant impedance according to embodiments of the present invention. The filter 800 includes a plurality RLC circuit units or poles 810a, 810b, 810c, etc., that are connected in series with each other between an input 801 and an output 802. Each pole 810 includes a first inductor 803, a second inductor 806, a capacitor 804, a resistor 805, along with other poles 810 that end in a termination resistor 812. The input signals come through input terminals 801a and 801b, wherein terminal 801a can serve as an input means for a positive differential component and input terminal 801b may serve as an input means for a negative differential potential. The output of the filter 800 is taken across output terminals 802a and 802b. The termination resistor 812 is connected across the output terminals 802. As with the filters 600 and 700, each pole 810 maintains a constant impedance to an incoming signal, if the inductors 803, 806 and the capacitor 804 satisfy equations (5)–(7). When using equations 7 and 8, the calculated inductor values are divided by 2, and assigned to the inductor 803 and 806. For example, if the inductor value is calculated to be 7.0 uH from equations 7 and 8, then the inductors 803 are set to 3.5 uH and the inductors 806 are set to 3.5 uH.

Filter 800 is illustrated to have 3 poles. However, any number of filter poles could be utilized. For example, filter 900 in FIG. 9 has four RLC poles 910 (a, b, c, d) connected in series between an input 901 and an output 902. Each pole 910 includes a first inductor 903, a second inductor 906, a capacitor 904, a resistor 905, along with other poles 910 that end in a termination resistor 912. Filter 900 is also a differential filter as is the one shown in FIG. 8. An input differential signal comes in through terminals 901a and 901b and passes through each individual pole 910 (a, b, c, d). The incoming signal after being filtered through each individual pole, is terminated in the termination resistor 912.

The values of each of the resistors 805 and 905 may differ as well as the values of inductors 803 & 903 and 806 & 906 and capacitors 804 and 904. However, the filters 800 and 900 will have a constant input impedance as long as the relationship described by formula (7) is substantially maintained within each individual pole. Each pole in all of the embodiments of the present invention filter is independent of another pole, which makes the filter more advantageous over conventional filters. It is understood by one skilled in the art that the present invention is not limited to the embodiments shown in FIGS. 5–9, as other arrangements will be apparent to those skilled in the art based on the discussion given above. In embodiments of the invention, the filters described herein have at least two poles in order to avoid sensitivity of components in the filter.

Figure 9:
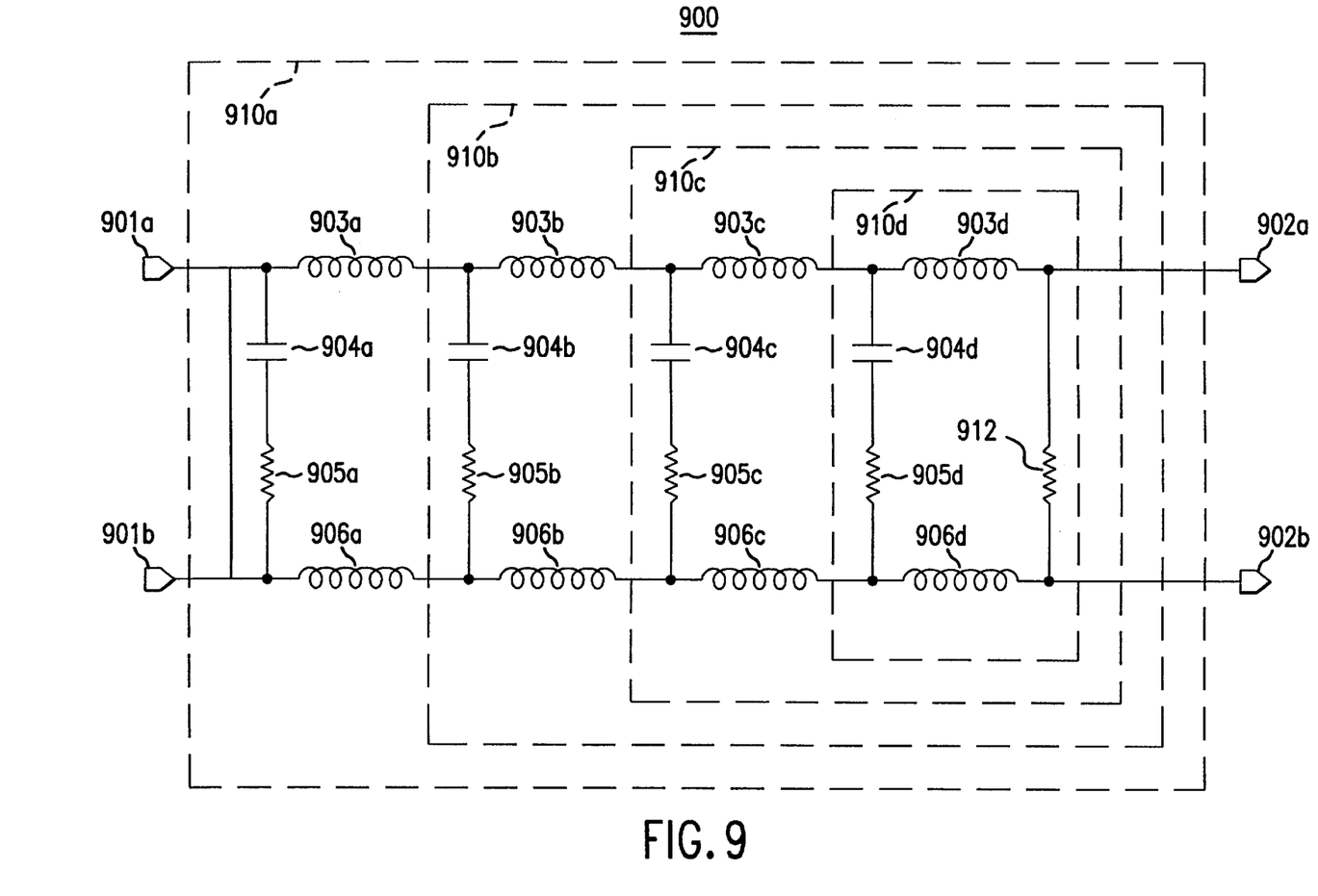
FIG. 9 illustrates a second multi-pole constant impedance differential low pass filter, according to embodiments of the present invention.

The differential filters shown in FIGS. 8 and 9 have a better noise reduction parameters than single-ended filters, shown in FIGS. 6 and 7. The values of the elements comprising the poles 810 and 910 do not need to be the same, i.e., resistor in one pole does not need to be equal to the resistor in another pole. Nonetheless, as long as the relationship in equation (7) is preserved, each pole is independently preserving constant impedance through the entire chain of the poles.

The constant impedance of the present invention filter allows the filter to be connected to other circuitry at all times, without regard for unwanted signal reflections. For example, the present invention filter can be connected to the physical layer of an IP telephone system at all times. This is an advantage over the conventional filter, which utilizes off-chip relays to connect/disconnect the conventional filter to/from the physical layer, depending on the mode of operation. Since the present invention filter is connected at all times, this alleviates the connecting/disconnecting of the filter when the system changes its modes.

In one embodiment of the present invention, the values of the components of the filters 800 or 900 may be as follows. The resistors 805 and 905 are of 100 Ohm each. The capacitors 804 and 904 are of 700 pF each. The inductors, 803, 806, 903, and 906 are of 3.5 u each. The mentioned vales will produce a constant input impedance of approximately 100 ohms at the input of the filters 800 and 900, according to equation (7). These values are provide for example purposes only, and are not meant to be limiting. Other filter component values will apparent to those skilled in the arts based on the discussion given herein.

Since, the filter poles are independent of one another, one can construct the filters according to a band of frequencies supplied to it. For example, if it is desired to have a filter accepting only 1 MHz frequencies, then all poles would have a 1 MHz passband response. If it is desired that the filter would have a gradual response to a range of 1 MHz to 10 MHz, each pole may have a different passband response according to the range.

Conclusion

Example embodiments of the methods, circuits, and components of the present invention have been described herein. As noted elsewhere, these example embodiments have been described for illustrative purposes only, and are not limiting. Other embodiments are possible and are covered by the invention. Such embodiments will be apparent to persons skilled in the relevant art(s) based on the teachings contained herein. Thus, the breadth and scope of the present invention should not be limited by any of the above-described exemplary embodiments, but should be defined only in accordance with the following claims and their equivalents.

What is claimed is:

1. A bandpass filter, comprising:

a plurality of low pass filter poles between an input and a first output of the bandpass filter that are series connected with each other, wherein each said lowpass filter pole includes a first capacitor and a first inductor; and a plurality of high pass filter poles between said input and a second output of the bandpass filter that are series connected with each other, said plurality of highpass filter poles arranged in parallel said plurality of lowpass filter poles, wherein each said highpass filter pole includes a second resistor, a second capacitor, and a second inductor;

a first of said plurality of high pass filter poles connected to said first capacitor of one of said plurality of low pass filter poles, and each remaining low pass filter pole of said plurality of low pass filter poles is terminated with a first resistor;

wherein a value of said first capacitor and said second capacitor are determined by the following relationship, $$C_{1,2} = \frac{L_{1,2}}{(R_{1,2})^2};$$

wherein $C_1$ is a value of said first capacitor, $C_2$ is a value of said second capacitor, $L_1$ is a value of said first inductor, $L_2$ is a value of said second inductor, and $R_1$ is a value of said first resistor, and wherein $R_2$ is a value of said second resistor.

2. The bandpass filter of claim 1, wherein $R_1=R_2$.

3. The bandpass filter of claim 1, wherein said first inductors in adjacent low pass filter poles are series-connected.

4. The bandpass filter of claim 1, wherein said second capacitors in adjacent high pass filter poles are series-connected.

5. The bandpass filter of claim 1, wherein each of said low pass filter poles is a differential low pass filter pole.

6. The bandpass filter of claim 1, wherein each of said high pass filter poles is a differential high pass filter pole.

7. The bandpass filter of claim 1, wherein an input impedance of each of said low pass filter poles is frequency independent.

8. The bandpass filter of claim 1, wherein an input impedance of each of said high pass filter poles is frequency independent.

9. The bandpass filter of claim 1, wherein $C_1$, $L_1$, and $R_1$ a common input impedance for said low pass filter poles, thereby providing a constant input impedance for the bandpass filter.

10. The bandpass filter of claim 1, wherein $C_2$, $L_2$, and $R_2$ provide a common input impedance for said high pass filter poles, thereby providing a constant input impedance for the bandpass filter.

11. The bandpass filter of claim 1, further comprising a first termination resistor connected to an output of said plurality of low pass filter poles.

12. The bandpass filter of claim 11, wherein a value of said first termination resistor is based on a common input impedance.

13. The bandpass filter of claim 11, wherein a value of said first termination resistor is $R_1$.

14. The bandpass filter of claim 1, further comprising a second termination resistor connected to an output of said plurality of high pass filter poles.

15. The bandpass filter of claim 14, wherein a value of said second termination resistor is a common input impedance.

16. The bandpass filter of claim 15, wherein a value of said second termination resistor is $R_2$.

17. The bandpass filter of claim 16, wherein $R_2=R_1$.

18. The bandpass filter of claim 1, wherein in each low pass filter pole, said first resistor is connected to ground, said first capacitor is connected to said first resistor, and said first inductor is connected to said first capacitor.

19. The bandpass filter of claim 1, wherein in each high pass filter pole, said second resistor is connected to ground, said second capacitor connected to said second resistor, and said second inductor is connected to said second capacitor.

20. A bandpass filter, comprising:

n-number of low pass filter poles between an input and a first output of the bandpass filter that are series connected with each other, (n-1) of said low pass filter poles terminated in a resistor; and n-number of high pass filter poles that are series connected with each other, a first of said n-number of high pass filter poles coupled to one of said low pass filter poles that is not terminated with said resistor, and a last of said n-number of high pass filter poles providing a second output of the bandpass filter;

wherein said n-number of lowpass filter poles are configured to provide a first constant input impedance over frequency, and said n-number of high pass filter poles are configured to provide a second constant input impedance over frequency.

21. The bandpass filter of claim 20, wherein said first constant input impedance is equal to said second constant input impedance.

* * * * *